United States Patent
Schroedl et al.

(10) Patent No.: US 9,433,123 B2
(45) Date of Patent: Aug. 30, 2016

(54) ELECTRIC APPARATUS

(71) Applicant: ABB Oy, Helsinki (FI)

(72) Inventors: Christoph Schroedl, Porvoo (FI); Till Huesgen, Burgberg (DE)

(73) Assignee: ABB Technology OY, Helsinki (FI)

( * ) Notice: Subject to any disclaimer, the term of this patent is extended or adjusted under 35 U.S.C. 154(b) by 5 days.

(21) Appl. No.: 14/534,752

(22) Filed: Nov. 6, 2014

(65) Prior Publication Data

US 2015/0156919 A1    Jun. 4, 2015

(30) Foreign Application Priority Data

Nov. 29, 2013  (EP) ..................... 13195008

(51) Int. Cl.
*H05K 7/20* (2006.01)

(52) U.S. Cl.
CPC .......... *H05K 7/20145* (2013.01); *H05K 7/209* (2013.01); *H05K 7/20127* (2013.01); *H05K 7/20918* (2013.01)

(58) Field of Classification Search
CPC ............... H05K 7/20; H05K 7/20154; H05K 7/20909; H05K 7/20918; H05K 2023/4056; H05K 5/00; H05K 5/02; G06F 1/20; G06F 1/203; H01L 23/34; H01L 23/40; H01L 23/437
USPC ........... 361/679.46–679.5, 679.54, 690–697, 361/688, 689, 704–712, 715, 719–724; 165/80.2, 80.3, 80.4, 80.5, 121–126, 165/185; 454/184; 363/141, 142, 143, 148; 312/223.2, 236; 174/50, 50.52, 520, 174/547, 548; 257/706–722
See application file for complete search history.

(56) References Cited

U.S. PATENT DOCUMENTS

| | | | | | |
|---|---|---|---|---|---|
| 7,816,631 | B2* | 10/2010 | Cramer | ................. | H02M 7/003 219/632 |
| 8,553,411 | B2* | 10/2013 | Abraham | ................. | G06F 1/20 361/679.47 |
| 8,559,173 | B2* | 10/2013 | Fujiwara | ................. | G06F 1/203 361/679.48 |
| 8,787,018 | B2* | 7/2014 | Nagano | .................... | H01G 2/10 361/678 |
| 9,167,730 | B2* | 10/2015 | Tuomola | ............ | H05K 7/20918 |

(Continued)

FOREIGN PATENT DOCUMENTS

| EP | 1 610 452 A2 | 12/2005 |
|---|---|---|
| EP | 1 628 514 A2 | 2/2006 |

(Continued)

OTHER PUBLICATIONS

European Search Report mailed on May 7, 2014, by the European Patent Office in corresponding European Patent Application No. 13 19 5008.

*Primary Examiner* — Michail V Datskovskiy
(74) *Attorney, Agent, or Firm* — Taft Stettinius & Hollister LLP

(57) ABSTRACT

An exemplary electric apparatus includes a fan for generating a first airflow, a component space includes a secondary electric component, and a housing. In order to obtain efficient cooling solution one or more walls separate the component space including the secondary electric component from the first cooling element for preventing the first airflow from entering the component space. A second cooling element has a first end in the component space and a second end located outside of the component space for dissipating heat received from the secondary electric component to the first airflow.

9 Claims, 1 Drawing Sheet

(56) References Cited

U.S. PATENT DOCUMENTS

| | | | |
|---|---|---|---|
| 2002/0064028 A1* | 5/2002 | Nielsen | H05K 7/20918 361/703 |
| 2006/0171115 A1 | 8/2006 | Cramer | |
| 2006/0227504 A1 | 10/2006 | Chen et al. | |
| 2009/0268405 A1* | 10/2009 | Kaveh | H05K 7/20918 361/697 |
| 2010/0195284 A1 | 8/2010 | Zheng | |
| 2010/0302728 A1* | 12/2010 | Knaup | H05K 7/20918 361/690 |
| 2011/0058330 A1* | 3/2011 | Abraham | G06F 1/20 361/679.47 |
| 2011/0108250 A1* | 5/2011 | Horng | G06F 1/28 165/121 |
| 2012/0250255 A1* | 10/2012 | Shigeno | H05K 7/20918 361/692 |
| 2012/0262969 A1* | 10/2012 | Nagano | H05K 7/20909 363/141 |

FOREIGN PATENT DOCUMENTS

| | | |
|---|---|---|
| EP | 1 610 452 A3 | 8/2007 |
| JP | 10-295087 A | 11/1998 |
| WO | WO 2008/071190 A1 | 6/2008 |

* cited by examiner

ELECTRIC APPARATUS

RELATED APPLICATION(S)

This application claims priority under 35 U.S.C. §119 to European application 13195008.1 filed in Europe on Nov. 29, 2013, the entire content of which is hereby incorporated by reference.

FIELD

This disclosure relates to an electric apparatus, and in particular to a solution for cooling the components of an electric apparatus.

BACKGROUND INFORMATION

Manufacturers constantly seek to improve on prior designs. For example, in some markets manufacturers attempt to obtain electric apparatuses which are smaller than the corresponding devices of a previous generation. A small size, however, can be problematic due to the heat generated by the various internal components. When the size of the apparatus decreases, the amount of space available for various cooling solutions becomes smaller.

In a known design using forced convection, a fan is utilized to generate an airflow through a housing of an electric apparatus. The electric components to be cooled are all located in the generated airflow. Therefore, heat dissipated by the electric components during use is transferred to the airflow and further on to the surrounding environment. Suitable dimensioning of the fan and the amount of air passing through the housing of the electric apparatus makes it possible to ensure that the temperature inside the housing remains at a suitable level.

One attribute of such designs allows for dirt and dust to enter the housing of the electric apparatus with the airflow. The amount of dirt and dust entering the housing increases as the amount of air in the airflow increases. This condition can be a problem in unclean environments, as some of the electric components of the electric apparatus can malfunction when too much dirt is accumulated inside the housing. Efficient filtering is not always an option, as this can call for maintenance by service personnel and additionally space which increases the size of the electric apparatus.

SUMMARY

An exemplary electric apparatus is disclosed, comprising: an inlet and an outlet for passing a first airflow generated by a fan through the apparatus; a first cooling element for receiving heat generated by a primary electric component and for dissipating heat into the first airflow; a component space including a secondary electric component; a housing that encloses the first cooling element, the secondary electric component, and the component space; one or more walls separating the component space containing the secondary electric component from the first cooling element and preventing the first airflow from entering the component space, and a second cooling element having a first end in the component space, which first end is thermally connected to the secondary electric component to receive heat generated by the secondary electric component, and a second end located outside of the component space to dissipate heat received from the secondary electric component to the first airflow.

BRIEF DESCRIPTION OF THE DRAWINGS

In the following the present disclosure will be described in closer detail by way of example and with reference to the attached drawings, in which.

DETAILED DESCRIPTION

Exemplary embodiments of the present disclosure provide an electric apparatus with an efficient cooling solution. Separating the component space from an airflow generated by a fan in combination with a cooling element extending between the airflow and the component space makes it possible to efficiently cool also components in the component space.

Figure 1:
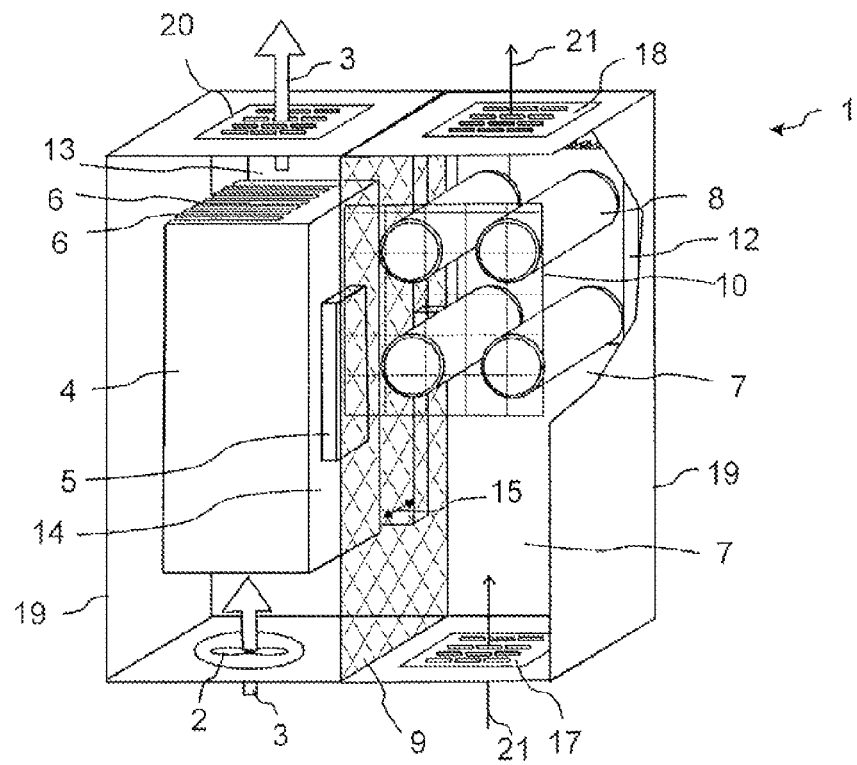
FIG. 1 illustrates a partial cross section of an electric apparatus according to an exemplary embodiment of the disclosure.
Figure 2:
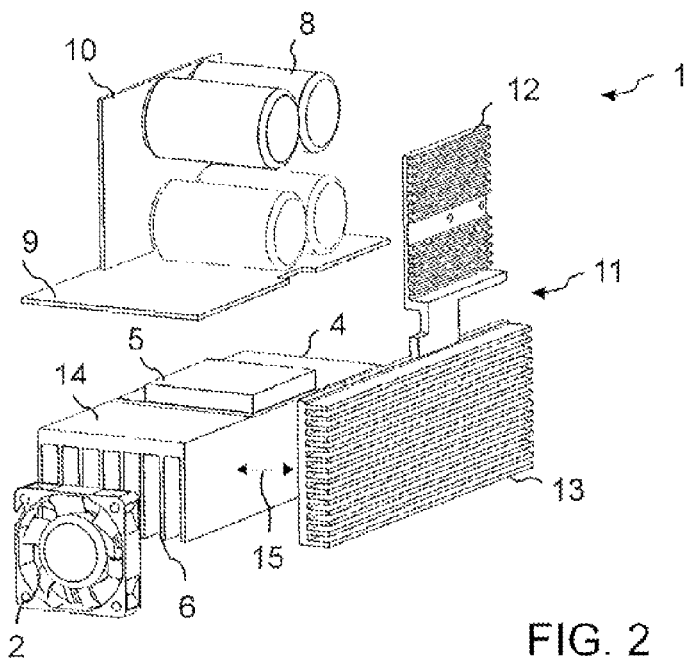
FIG. 2 illustrates details of the electric apparatus in FIG. 1 according to an exemplary embodiment of the disclosure.

FIG. 1 illustrates a partial cross section of an electric apparatus according to an exemplary embodiment of the disclosure, and FIG. 2 illustrates details of the electric apparatus in FIG. 1. As illustrated in FIGS. 1 and 2, the electric apparatus 1 can be a motor drive, such as a frequency controller, controlling supply of electricity to an electric motor. It should, however, be observed that the disclosure can be implemented also in other electric apparatuses as desired.

FIG. 1 is a partial cross section of the electric apparatus, where the front walls or doors have been removed to illustrate the inner parts of the apparatus. Also a section of the top left part of the lid and of the right side wall has been left out. Two of the circuit boards have been illustrated as transparent and provided with a hatching in order to clarify the location of the circuit boards and also to show components located behind them. FIG. 2 does not illustrate the housing at all, but only inner components of the electric apparatus, which ordinarily are enclosed by the housing.

The electric apparatus 1 can include a fan 2 for generating a first airflow 3 through the electric apparatus 1. In the illustrated embodiment, the fan is by way of example arranged at an inlet 22 in the bottom of the housing 19, though in another exemplary embodiment the fan 2 can be located within the housing at a distance from the inlet 22, or at the outlet 20 of the housing 19 for generating the first air flow 3 by sucking air out of the housing 19. Still, according to another exemplary embodiment, the fan can be located at a distance from the housing 19, such as in an air conduit passing air towards the inlets of the housing or passing air away from the outlets of the housing.

A first cooling element 4 in contact with primary electric component 5 is arranged in the first airflow 3. The primary electric component 5 can include a power module with semiconductors that generate a significant amount of heat during use, for example. The primary electric component 5 can be directly mounted onto a first surface 14 of the first cooling element 4 with screws, for example. A good thermal connection should be obtained between the primary electric component 5 and the first surface 14 of the first cooling element 4. This can be obtained with a thermal interface material. Heat received via the first surface 14 of the first cooling element 4 is dissipated into the first airflow 3 via fins 6 arranged on a second surface of the cooling element, which can be an opposite surface as compared to the first surface 14.

The electric apparatus 1 also can include a component space 7 containing a secondary electric component 8. In the illustrated example it is by way of example assumed that the component space contains four capacitors. One or more walls 9 separate the component space 7 from the first cooling element 4 such that the first airflow 3 is prevented from entering the component space 7. In the illustrated example the wall 9 is a circuit board, such as a PCB (printed circuit board) which can carry a plurality of electric components which are also located in the component space 7. Additionally, a second circuit board 10 is arranged in the component space in order to facilitate electrical connections to the secondary electric component 8.

As the first airflow 3 generated by the fan 2 is prevented from reaching the component space, dust and dirt can be prevented from reaching the component space 8 with the first airflow 3. In order to ensure cooling for the secondary electric component 8 the electric apparatus 1 can include a second cooling element 11. The second cooling element has a first end 12 in the component space and a second end 13 which is located outside of the component space 7 and in the airflow 3 from the fan 2. The first end 12 is thermally connected to the secondary component 8 for receiving heat from the secondary component and for passing heat via the second end 13 to the first airflow 3. The thermal connection between the secondary electric component 8 and the first end 12 can be accomplished by arranging these parts close enough to each other such that they touch each other. A thermal interface material (TIM) can be used between the secondary electric component 8 and the first end 12 of the second cooling element to ensure a sufficient thermal connection. In order to efficiently dissipate heat from the second cooling element 11 to the first airflow 3, according to an exemplary embodiment of the present disclosure, the second end 13 of the second cooling element 11 can be provided with fins.

The second cooling element 11 can be implemented as a single solid part of a suitable metal material, such as aluminum, for example, which passes heat from the secondary electric component 8 to the first airflow 3 by conducting the heat. Alternatively, the second cooling element 11 can contain one or more fluid channels passing fluid between the first end 12 and the second end 13. Such a solution can be obtained by including a heat pipe in the second electric element, or by designing a 2-phase cooling solution with the first end 12 as an evaporator evaporating a liquid and the second end 13 as a condenser condensing the fluid back to liquid before returning it to the first end 12. It is also possible to implement the second cooling element 11 such that the first end 12 and the second end 13 are manufactured as separate parts which are thermally and mechanically connected to each other.

According to an exemplary embodiment of the present disclosure, to prevent heat generated by the primary electric component 5 or the first cooling element 4 from reaching the second end 13 of the second cooling element 11, an insulating air gap 15 can be arranged between the second end 13 and the first cooling element 4. According to yet another exemplary embodiment, the first cooling element 4 can be mechanically attached to the second end 13 of the second cooling element 11 based on production factors. However, also in such an exemplary solution, the attachment can be implemented so that as little heat as possible can be transferred from the first cooling element 4 to the second end 13 of the second cooling element 11.

According to an exemplary embodiment, the component space 7 can be provided with an inlet 17 in a lower part and an outlet 18 in an upper part of the component space 7. Air heated within the component space 7 can thereby be allowed to exit the component space via the outlet 18 while substitute air from the surroundings can enter the components space via the inlet 17 to the component space 7. Such natural convection without use of a fan will generate a second airflow 21 passing through the component space. Natural convection refers to fluid (such as air) motion which is not generated by any external source (e.g., a pump, fan, suction device, etc.) but only by density differences in the fluid occurring due to temperature differences, as heated air is lighter than cold air. The second airflow 21 is much weaker than the first airflow 3 generated by the fan 2, and the amount of dust and dirt entering the component space 7 due to the second airflow is therefore minimal. In order to increase the amount of heat which can be dissipated from the component space 7 with the second airflow, the first end 12 of the second cooling element 11 can be provided with fins located in the second air flow 21.

If the secondary electric component 8 is a capacitor, such as an electrolytic capacitor, this capacitor and other capacitors in the component space 7 can be arranged substantially perpendicularly to the second airflow 21 in the component space 7. As a result, the capacitors can be mechanically attached to the second cooling element 11 in a rigid and stable configuration, by attaching the first ends of the capacitors to the first end 12 of the second cooling element 11 and by attaching the second ends of the capacitors to the PCB 10 providing electrical connections to the capacitors. In such a position and with small mutual gaps allowing airflow between the capacitors, the capacitors can be efficiently cooled by the second airflow 21 and blocking of the second airflow due to the location of the capacitors or the location of the circuit boards can be avoided.

A motor drive with a power rating of 2.2 kW (400V) suitable for use in a surrounding with a temperature of about 50° C. can in practice be manufactured to be as small as 130×130×60 mm when constructed as previously explained.

As shown in FIGS. 1 and 2 and according to an exemplary embodiment disclosed herein, the inlets 17 and 22 to the housing can be located in the bottom of the housing and the outlets 18 and 20 from the housing can be located in the upper wall or roof of the housing. However, this is naturally only by way of example. In order to obtain a housing suitable for use in outside conditions or in environments exhibiting dirty conditions, for example, the inlets and outlets can be arranged differently. For example, according to an exemplary embodiment disclosed herein, a protective cap can be arranged on top of the housing to prevent water (such as condensation water or dripping water, for example) from reaching the outlet at the roof of the housing. As a result, air flowing out via the outlets does not flow straight upwards from the outlet, but instead the protective cap can direct it sideways or even downwards on the outer side of the housing before the airflow is released to the surroundings.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An electric apparatus, comprising:
an inlet and an outlet for passing a first airflow generated by a fan through the apparatus;
a first cooling element for receiving heat generated by a primary electric component and for dissipating heat into the first airflow;
a component space including a secondary electric component;
a housing that encloses the first cooling element, the secondary electric component, and the component space;
one or more walls separating the component space containing the secondary electric component from the first cooling element and preventing the first airflow from entering the component space, and
a second cooling element having a first end in the component space, which first end is thermally connected to the secondary electric component to receive heat generated by the secondary electric component, and a second end located outside of the component space to dissipate heat received from the secondary electric component to the first airflow,
wherein the first end of the second cooling element is provided with fins, and the second end of the second cooling element is provided with fins.

2. The electric apparatus according to claim 1, wherein a lower part of the component space is provided with an inlet and an upper part of the component space is provided with an outlet for allowing air heated within the component space to flow out via the outlet and to be replaced by air from outside of the housing via the inlet due to natural convection without use of a fan.

3. The electric apparatus according to claim 1, wherein the second cooling element comprises a flow channel passing fluid between the first and second end of the second cooling element.

4. The electric apparatus according to claim 1, wherein the second cooling element consists of two separate parts which are thermally connected to each other for passing heat from the first end of the second cooling element to the second end of the second cooling element.

5. An electric apparatus, comprising:
an inlet and an outlet for passing a first airflow generated by a fan through the apparatus;
a first cooling element for receiving heat generated by a primary electric component and for dissipating heat into the first airflow;
a component space including a secondary electric component;
a housing that encloses the first cooling element, the secondary electric component, and the component space;
one or more walls separating the component space containing the secondary electric component from the first cooling element and preventing the first airflow from entering the component space, and
a second cooling element having a first end in the component space, which first end is thermally connected to the secondary electric component to receive heat generated by the secondary electric component, and a second end located outside of the component space to dissipate heat received from the secondary electric component to the first airflow,
wherein at least one of the one or more walls separating the component space from the first cooling element includes a circuit board.

6. An electric apparatus, comprising:
an inlet and an outlet for passing a first airflow generated by a fan through the apparatus;
a first cooling element for receiving heat generated by a primary electric component and for dissipating heat into the first airflow;
a component space including a secondary electric component;
a housing that encloses the first cooling element, the secondary electric component, and the component space;
one or more walls separating the component space containing the secondary electric component from the first cooling element and preventing the first airflow from entering the component space, and
a second cooling element having a first end in the component space, which first end is thermally connected to the secondary electric component to receive heat generated by the secondary electric component, and a second end located outside of the component space to dissipate heat received from the secondary electric component to the first airflow,
wherein the secondary electric component is a capacitor arranged substantially perpendicularly to a second air flow flowing from the inlet of the component space to the outlet of the component space and with a first end attached to the first end of the second cooling element and with a second end attached to a circuit board in the component space.

7. The electric apparatus according to claim 1, wherein the primary electric component includes one or more semiconductor components attached to the first cooling element.

8. The electric apparatus according to claim 1, wherein the first cooling element is separated from the second end of the second cooling element by an air gap.

9. The electric apparatus according to claim 1, wherein the electric apparatus is a motor drive controlling supply of electricity to an electric motor.

* * * * *